(12) United States Patent
Chang et al.

(10) Patent No.: US 7,279,430 B2
(45) Date of Patent: Oct. 9, 2007

(54) PROCESS FOR FABRICATING A STRAINED CHANNEL MOSFET DEVICE

(75) Inventors: Sun-Jay Chang, Taitung County (TW); Shien-Yang Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 197 days.

(21) Appl. No.: 10/919,684

(22) Filed: Aug. 17, 2004

(65) Prior Publication Data

US 2006/0040503 A1 Feb. 23, 2006

(51) Int. Cl.
*H01L 21/302* (2006.01)

(52) U.S. Cl. ............... 438/723; 438/197; 438/217; 438/724

(58) Field of Classification Search ............ 438/41, 438/174, 197, 217, 301, 514, 723, 724, 756, 438/757; 257/616
See application file for complete search history.

(56) References Cited

U.S. PATENT DOCUMENTS

| | | | |
|---|---|---|---|
| 5,683,934 A | | 11/1997 | Candelaria |
| 5,891,792 A | * | 4/1999 | Shih et al. ............ 438/525 |
| 6,350,993 B1 | | 2/2002 | Chu et al. |
| 6,395,624 B1 | | 5/2002 | Bruce et al. |
| 6,492,216 B1 | * | 12/2002 | Yeo et al. ............ 438/197 |
| 6,498,359 B2 | | 12/2002 | Schmidt et al. |
| 6,544,854 B1 | * | 4/2003 | Puchner et al. ......... 438/308 |
| 6,657,223 B1 | * | 12/2003 | Wang et al. ............ 257/19 |
| 6,806,151 B2 | * | 10/2004 | Wasshuber et al. ....... 438/301 |
| 6,808,970 B2 | * | 10/2004 | Feudel et al. .......... 438/174 |

OTHER PUBLICATIONS

Streetman, Solid State Electronic Devices, 1990, Prentice Hall, 3rd ed., pp. 300-301, 326-327, 350 and 351.*
Wolf et al., Silicon Processing for the VLSI Era, 1986, Lattice Press, vol. 1, pp. 305, 319-321, 325, 327, and 534.*
Wolf, Silicon Processing for the VLSI Era, 2002, Lattice Press, vol. 4, p. 249.*
Selvakumar, C.R., et al., "SiGe-Channel n-MOSFET by Germanium Implantation," IEEE Electron Device Letters, vol. 12, No. 8, (Aug. 1991) pp. 444-446.

* cited by examiner

*Primary Examiner*—Kin-Chan Chen
(74) *Attorney, Agent, or Firm*—Slater & Matsil, L.L.P.

(57) ABSTRACT

A process for fabricating a MOSFET device featuring a channel region comprised with a silicon-germanium component is provided. The process features employ an angled ion implantation procedure to place germanium ions in a region of a semiconductor substrate underlying a conductive gate structure. The presence of raised silicon shapes used as a diffusion source for a subsequent heavily doped source/drain region, the presence of a conductive gate structure, and the removal of dummy insulator previously located on the conductive gate structure allow the angled implantation procedure to place germanium ions in a portion of the semiconductor substrate to be used for the MOSFET channel region. An anneal procedure results in the formation of the desired silicon-germanium component in the portion of semiconductor substrate to be used for the MOSFET channel region.

27 Claims, 5 Drawing Sheets

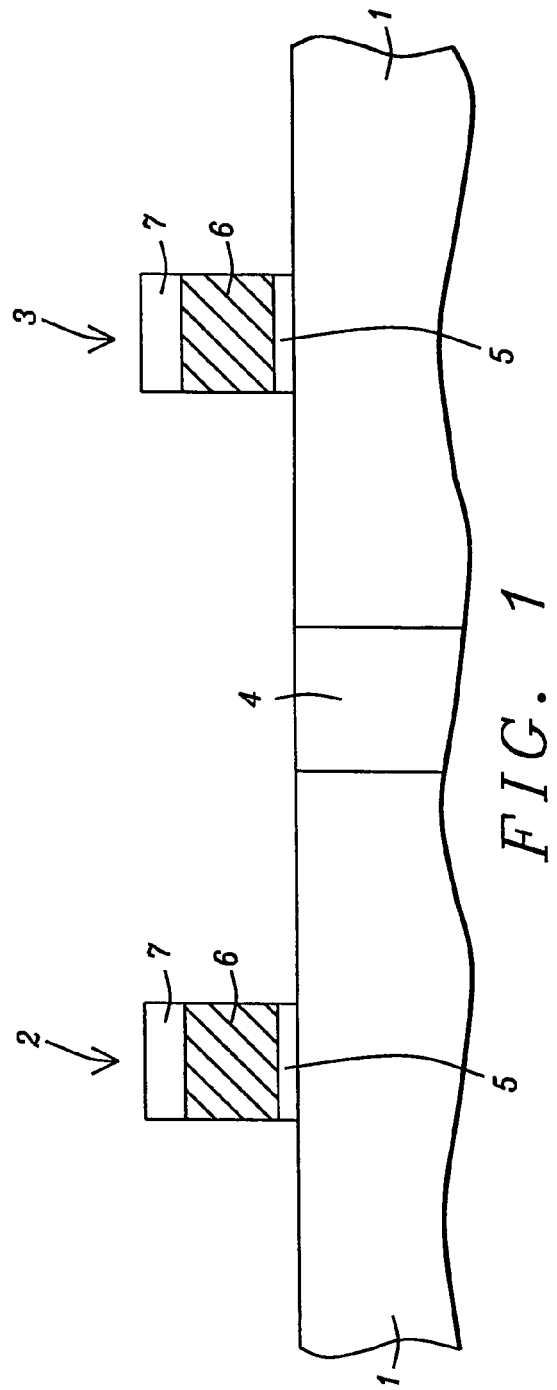
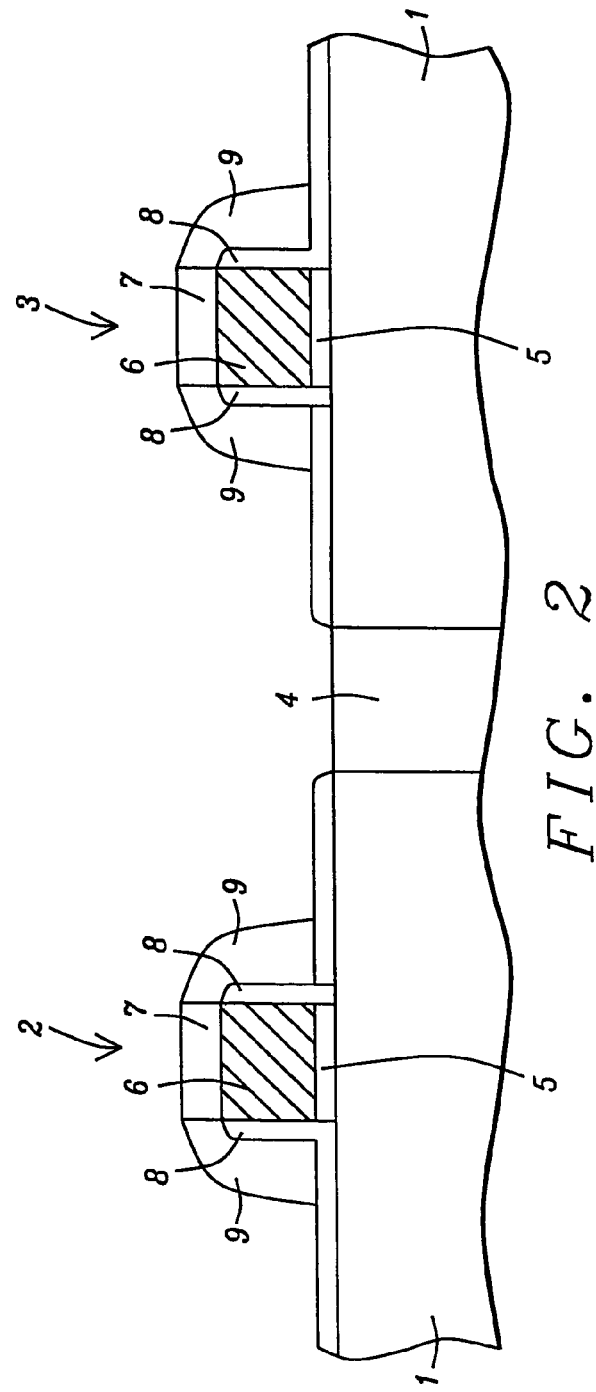

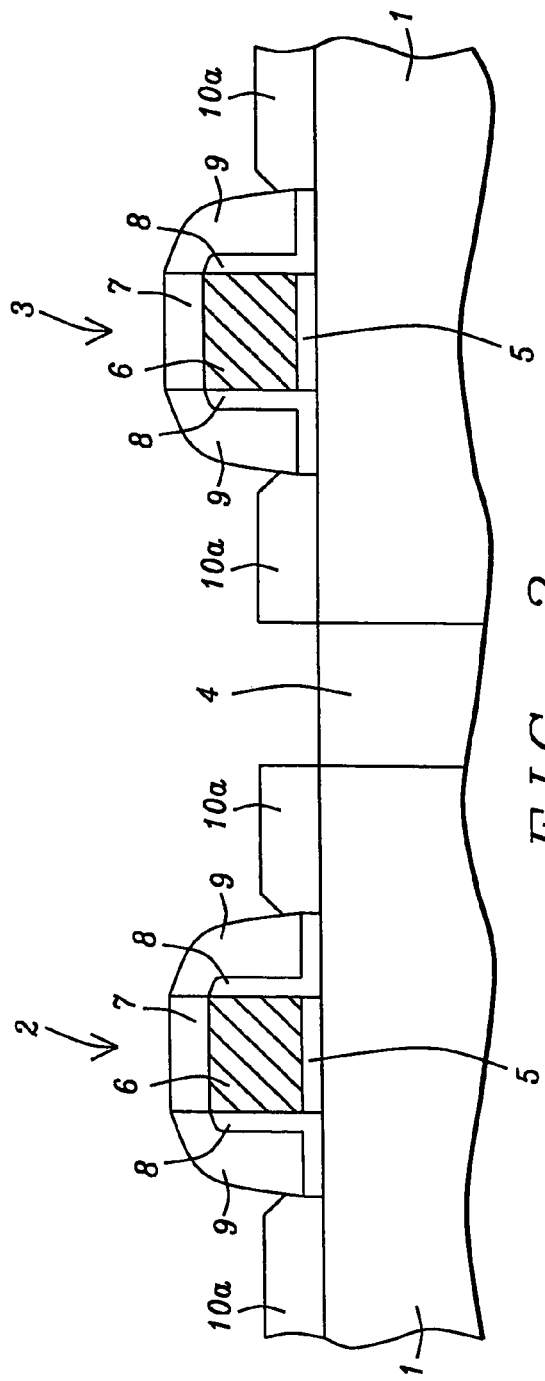
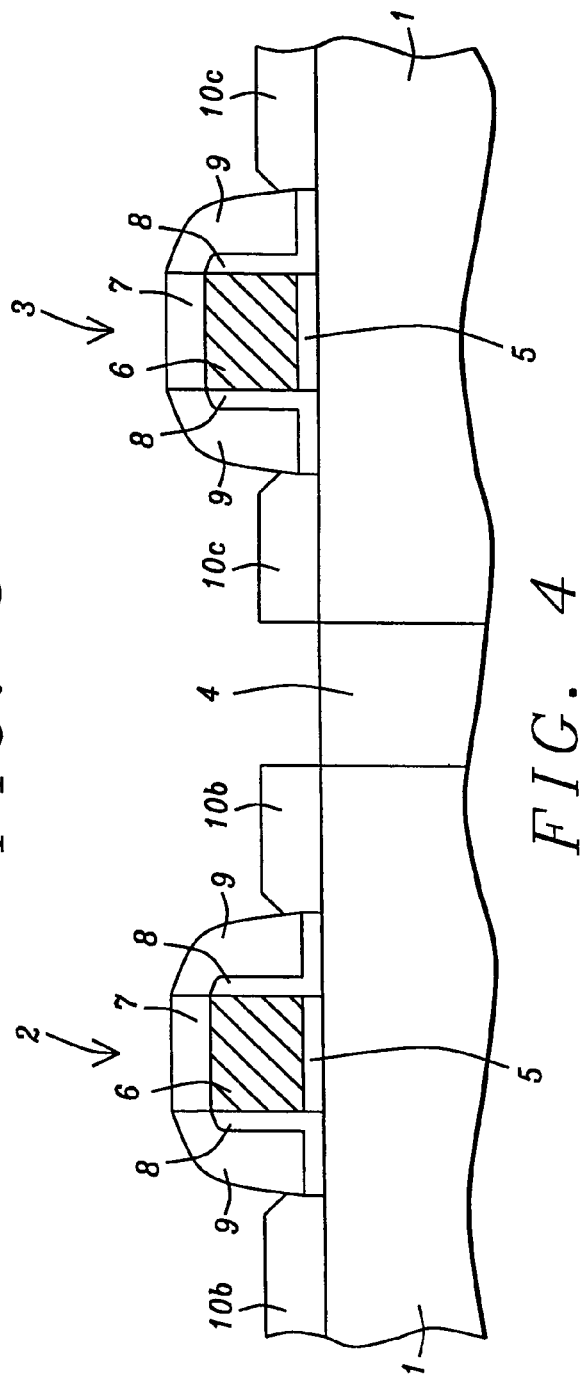

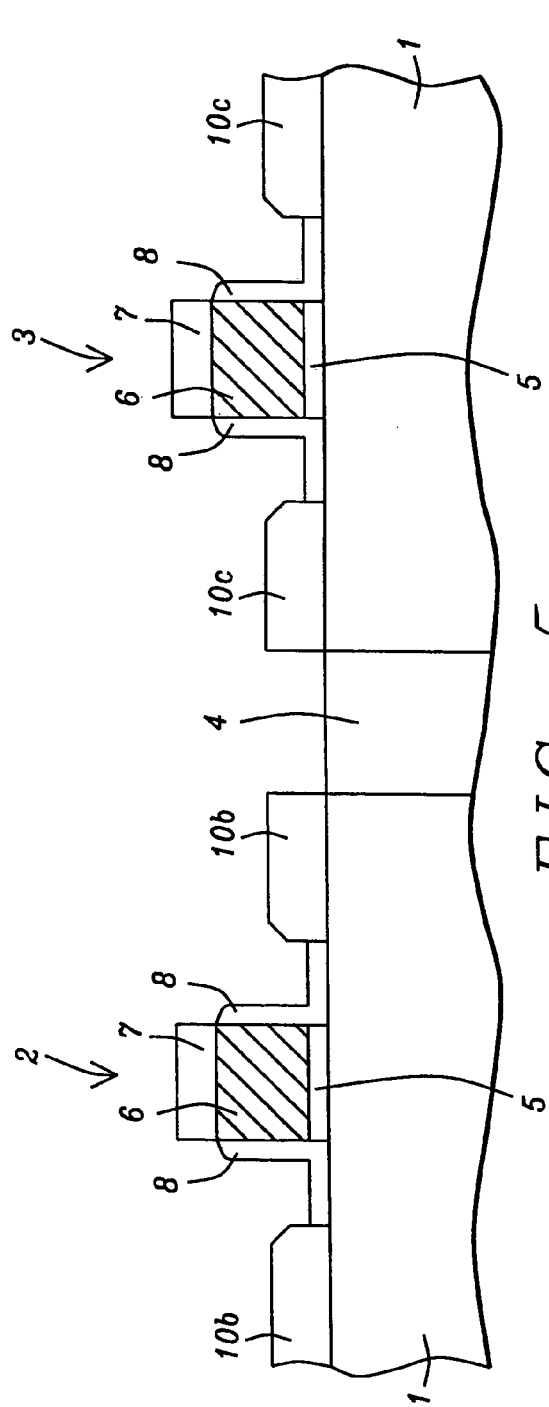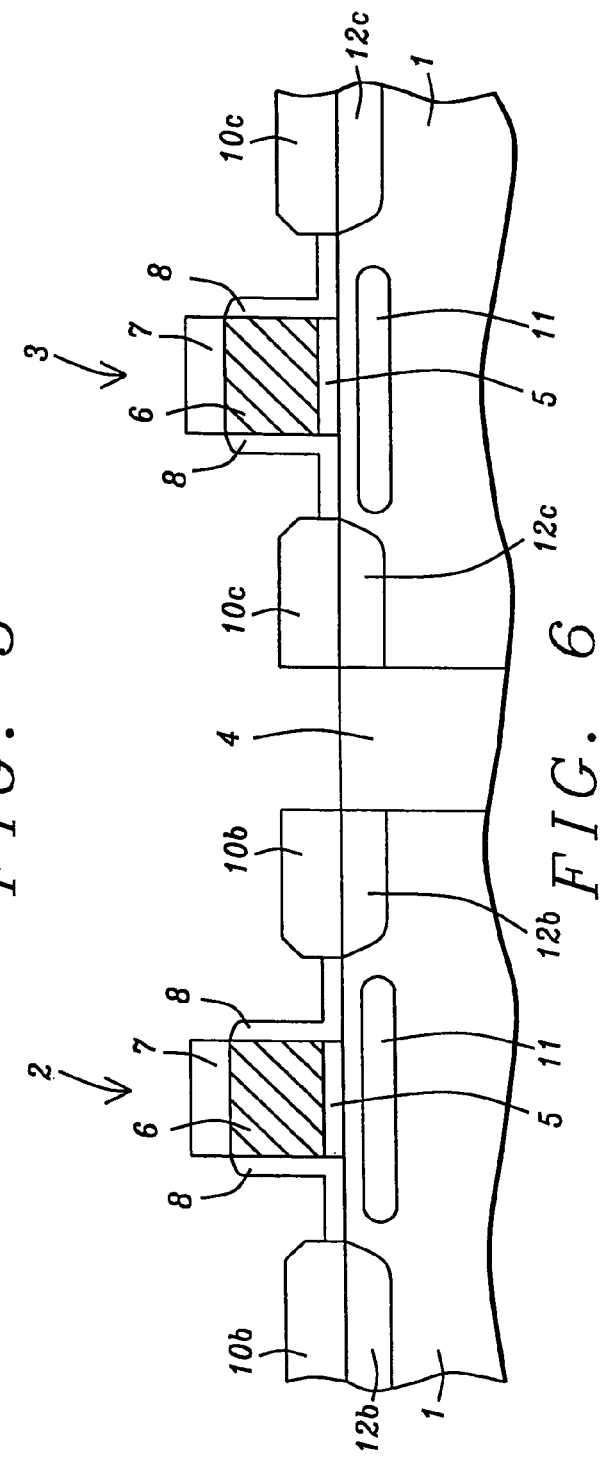

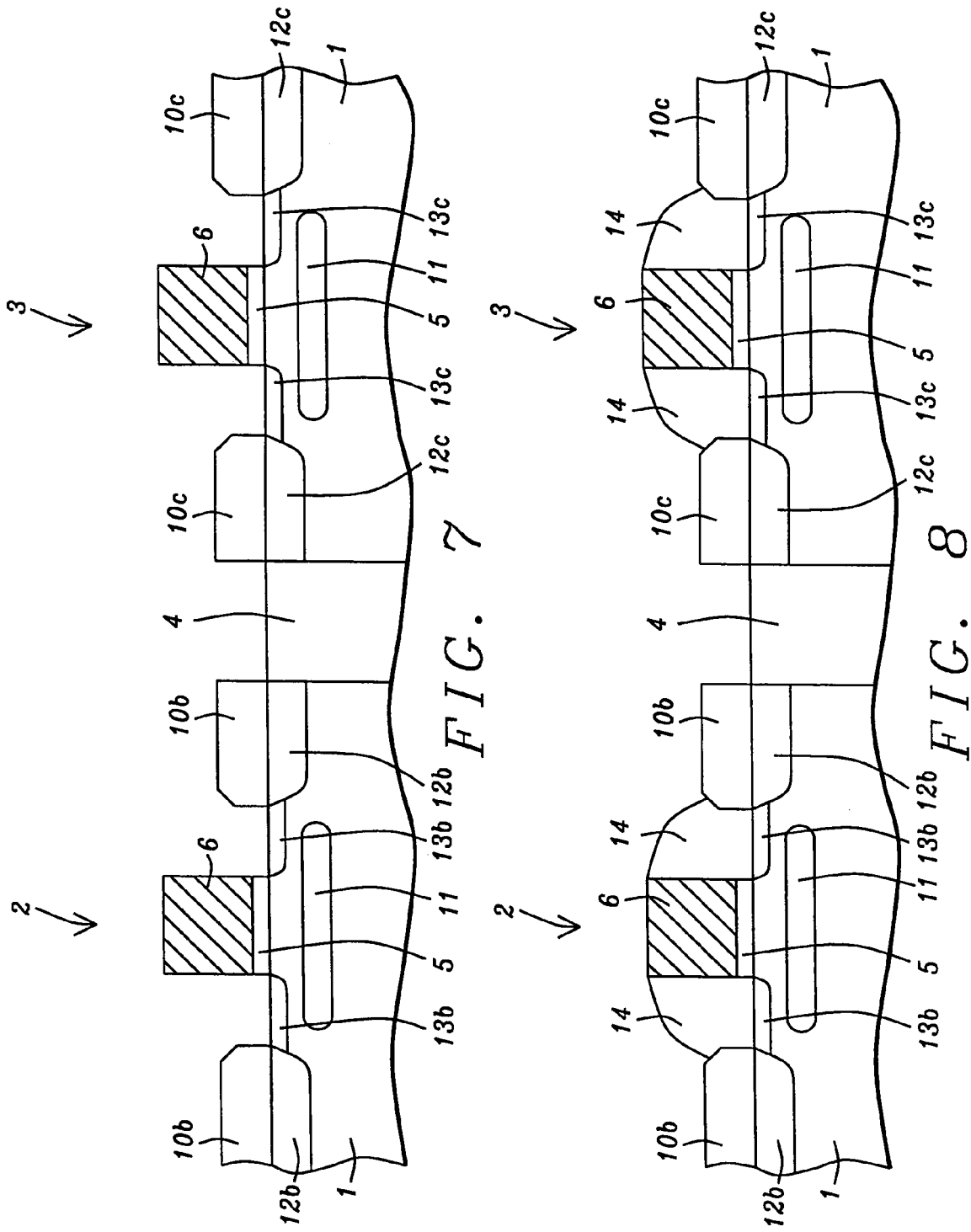

PROCESS FOR FABRICATING A STRAINED CHANNEL MOSFET DEVICE

TECHNICAL FIELD

The present invention relates generally to methods used to fabricate semiconductor devices and more specifically to a method used to fabricate a metal oxide semiconductor field effect transistor (MOSFET) device comprised with a strained channel region.

BACKGROUND

In a continuing effort to increase performance MOSFET devices have been fabricated using strained channel regions located in portions of a semiconductor substrate. Strained channel regions allow enhanced carrier mobility to be realized, thereby resulting in increased performance when used for N channel (NMOSFET) or for P channel (PMOSFET) devices. The use of semiconductor alloy layers, such as silicon-germanium or silicon-germanium-carbon, followed by an overlying thin semiconductor layer can result in the overlying semiconductor layer having the desired strain component needed for carrier mobility enhancement. Thus, a strained semiconductor layer overlying a semiconductor alloy layer, underlying a gate structure and surrounded by adjacent source/drain regions, can be used as an attractive configuration for MOSFET devices.

This configuration can, however, be difficult to process in addition to presenting junction leakage concerns as a result of the blanket semiconductor alloy layer. The epitaxial growth of the semiconductor alloy layer, such as a silicon-germanium layer, can be costly and difficult to accurately control the level of germanium in the epitaxially grown semiconductor alloy layer. In addition, the presence of a blanket semiconductor alloy layer allows an unwanted interface between the source/drain regions to exist, possibly introducing junction leakage.

Embodiments of the present invention provide a strained channel region for MOSFET, or for complimentary (CMOS) devices, wherein a silicon-germanium region will be formed in a channel region, while reducing or eliminating junction leakage that can result when a blanket silicon-germanium region directly interfaces between source/drain regions. Embodiments of the present invention may also feature a process sequence that allows integration of the process steps used for formation of the semiconductor alloy region and for formation of the MOSFET lightly doped source/drain (LDD) region.

SUMMARY OF THE INVENTION

It is an object of this invention to form a MOSFET device with a strained channel region.

It is another object of this invention to form a semiconductor alloy region in a MOSFET channel region, without or with reduced risk of the same semiconductor alloy region interfacing the MOSFET heavily doped source/drain region.

It is still another object of this invention to perform a pocket implantation procedure to place germanium ions in a MOSFET channel region and in raised source/drain silicon shapes.

In accordance with the present invention a method of forming a MOSFET device featuring a strained channel region, accomplished via pocket implantation of germanium into a subsequent MOSFET channel region, is described. After definition of a conductive gate structure overlaid with an insulator hard mask shape is formed on a gate insulator layer, dummy sidewall spacers are formed on the sides of the conductive gate structure. A selective epitaxial silicon procedure is employed to form raised, intrinsic silicon shapes on regions of the semiconductor substrate not occupied by the conductive gate structure or by the dummy sidewall spacers. An ion implantation procedure is employed to place the dopants for subsequent heavily doped source/drain region in the raised silicon shapes. Removal of the dummy sidewall spacers is followed by a germanium pocket implantation procedure placing germanium ions in an area of the semiconductor substrate underlying the conductive gate structure in addition to placing germanium ions in the raised silicon shapes. An anneal procedure activates the implanted germanium ions resulting in a strained channel region underlying the conductive gate structure, with the anneal procedure also allowing out diffusion of dopants from the raised silicon shapes forming a heavily doped region in an underlying portion of the semiconductor substrate. After removal of the insulator hard mask shape lightly doped source/drain (LDD) regions are formed in portions of the semiconductor substrate previously occupied by the dummy sidewall spacers. Insulator spacers may be formed on the sides of the conductive gate structure, overlying the LDD regions.

BRIEF DESCRIPTION OF THE DRAWINGS

The object and other advantages of this invention are best described in the preferred embodiment with reference to the attached drawings that include:

FIGS. 1-9, which schematically, in cross-sectional style, describe various process steps of fabricating a MOSFET device featuring a strained channel region obtained via a pocket implantation of germanium ions into a portion of a semiconductor substrate underlying the MOSFET conductive gate structure.

DETAILED DESCRIPTION OF ILLUSTRATIVE EMBODIMENTS

Figure 9:
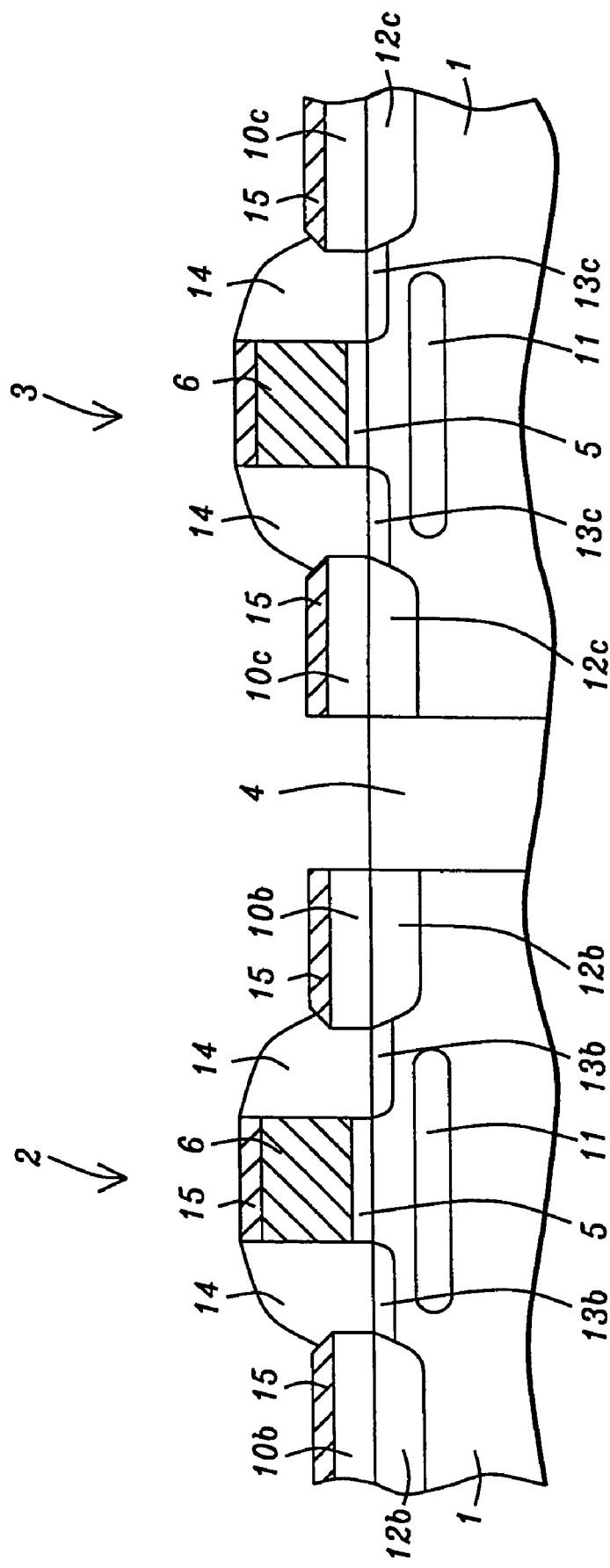

The method of forming a MOSFET device featuring a strained channel region obtained via pocket implantation of germanium ions in a portion of a semiconductor substrate located underlying the conductive gate structure will now be described in detail. The strained channel region featured in this invention can be applied to either an N channel (NMOSFET), or to a P channel (PMOSFET) device, and for this description will be applied to a complimentary (CMOS) device comprised with both NMOSFET and PMOSFET devices.

Semiconductor substrate 1, comprised of P-type single crystalline silicon featuring a <100> crystallographic orientation, is used and schematically shown in FIG. 1. Region 2 of semiconductor substrate 1 will be used to accommodate a subsequent NMOSFET device while region 3 of semiconductor substrate 1 will be the location for a PMOSFET device. Isolation region 4, such as an insulator filled shallow trench (STI) region, a thermally grown field oxide (FOX) region, or the like may be formed in an area of semiconductor substrate 1 where physical isolation of the MOSFET regions is desired. The STI region may comprise silicon oxide deposited by chemical vapor deposition (CVD) techniques, while the FOX region may comprise thermally grown silicon dioxide. An N well region, not shown in the drawings, may be formed in a top portion of substrate 1 in region 3 to accommodate a subsequent PMOSFET device. The N well region may be formed via implantation of arsenic or phosphorous ions. The result of these procedures is schematically shown in FIG. 1.

Gate insulator layer 5, may comprise silicon dioxide thermally grown on exposed surfaces of semiconductor substrate 1, preferably to a thickness between about 10 and about 40 Angstroms. Conductive layer 6, such as a doped polysilicon layer, may be formed via low pressure chemical vapor deposition (LPCVD) procedures to a thickness between about 800 and about 2000 Angstroms. Doped polysilicon layer 6 may be doped in situ during deposition via the addition of arsine or phosphine to a silane ambient, or a polysilicon layer can be intrinsically deposited then doped via implantation of arsensic or phosphorous ions. Insulator layer 7 may comprise silicon oxide or silicon oxynitride deposited via LPCVD or via plasma enhanced chemical vapor deposition (PECVD) procedures to a thickness between about 100 and about 500 Angstroms.

The gate insulator layer 5, conductive layer 6, and insulator layer 7 may be patterned by deposition and patterning a photoresist shape, not shown in the drawings. The photo resist shape may be used as a mask to allow an etching process, such as an anisotropic reactive ion etch (RIE) procedure, to define conductive gate structures 6, overlaid with insulator hard mask shapes 7, in both NMOSFET region 2, and PMOSFET region 3. The anisotropic RIE procedure may be performed using $CF_4$ or $CHF_3$ as an etchant for insulator layer 7, while $C_{12}$ may be used as a selective etchant for the conductive layer 6 formed of polysilicon, with the selective $C_{12}$ etch cycle terminating at the appearance of the top surface of silicon dioxide gate insulator layer 5. Removal of the photoresist shape may be accomplished via plasma oxygen ashing and wet cleans with a buffered hydrofluoric (BHF) acid cycle of the wet clean procedure resulting in removal of portions of gate insulator 5 not covered by the conductive gate structures.

Referring now to FIG. 2, a silicon oxide layer 8 may be formed by a thermal oxidation procedure to a thickness between about 30 and about 100 Angstroms on the exposed surfaces of the conductive gate structures 6, as well as on the portions of semiconductor substrate 1 not covered by the conductive gate structures 6. A silicon nitride layer may be formed via LPCVD or PECVD procedures to a thickness between about 300 and about 1000 Angstroms. A selective anisotropic RIE procedure may be performed using $Cl_2$ or $CF_4$ to define silicon nitride dummy spacers 9 on the portions of silicon oxide layer 8 located on the sides of conductive gate structures 6 and on the sides of insulator hard mask shapes 7. The dummy spacer defining RIE procedure selectively terminates at the appearance of the top surface of silicon oxide layer 8.

Referring now to FIG. 3, after removal of portions of silicon oxide layer 8 (FIG. 2) via, for example, a BHF procedure, portions of semiconductor substrate 1 that are not covered by conductive gate structures 6 or by silicon nitride dummy spacers 9 are exposed. An epitaxial growth procedure may be employed to selectively grow intrinsic silicon shapes 10a on the exposed portions of semiconductor substrate 1. The epitaxial silicon growth procedure may be performed, for example, at a temperature between about 700 and about 1000° C. using silane or disilane as a source, resulting in the growth of intrinsic silicon regions 10a at a thickness between about 200 and about 800 Angstroms.

Referring now to FIG. 4, photoresist masking and ion implantation procedures are next applied to intrinsic silicon shapes 10a (FIG. 3) in NMOSFET region 2 resulting in $N^+$ silicon shapes 10b, while additional photoresist masking and ion implantation procedures are used to allow the intrinsic silicon shapes 10a (FIG. 3) in PMOSFET region 3 to be $P^+$ doped, resulting in $P^+$ silicon shapes 10c. Ion implantation procedures may be performed, for example, using arsenic or phosphorous ions at energy between about 5 and about 40 KeV at a dose between about 1E15 and about 5E15 atoms/$cm^2$ for $N^+$ silicon shapes 10b, while boron ions implanted at an energy between about 3 and about 15 KeV at a dose between about 1E15 and about 5E15 atoms/$cm^2$ may be employed for $P^+$ silicon shapes 10c.

Removal of silicon nitride dummy spacers 9 is illustrated in FIG. 5. A wet etch procedure employing a hot phosphoric acid solution may be used to selectively etch the silicon nitride dummy spacers 9. The wet etch procedure selectively terminates on the portion of the silicon oxide layer 8 overlying the portions of semiconductor substrate 1 located between the raised silicon shapes 10b, 10c and the conductive gate structure 6. Insulator hard mask shapes 7 provide protection of conductive gate structure 6 during the selective hot phosphoric acid procedure.

Referring now to FIG. 6, a silicon-germanium region 11 is formed. The silicon-germanium region 11 may be formed by the implantation of germanium ions into a portion of semiconductor substrate 1 to be employed as a strained channel region for a MOSFET device. The implantation of germanium ions may be performed at an energy of about 50 and about 150 KeV at a dose of about 5E14 and about 1E16 atoms/$cm^2$ with an implant angle of about 15 and about 30°. The combination of the implant angle and the presence of the raised silicon shapes results in the strained silicon-germanium region 11 being located under the conductive gate structure 6. The raised silicon shapes 10 prevent the silicon-germanium region from extending into the area of the substrate 1 underlying the raised silicon shapes 10c. It should be noted that the insulator hard mask shape 7 protected the conductive gate structure 6 from the germanium implantation procedure.

In this embodiment, the germanium implant procedure is not performed simultaneously with an LDD implantation procedure. Therefore, photoresist masking to accommodate both P type and N type LDD implantation procedures may not be needed with this embodiment.

An anneal procedure, such as a rapid thermal anneal (RTA) procedure may be employed at a temperature of about 800 and about 1050° C. to activate the implanted germanium ions in the strained silicon-germanium region 11. It should be noted that the anneal procedure may cause out diffusion of dopants from the raised silicon shapes 10b and 10c into substrate 1, thereby forming source/drain regions 12b and 12c. In particular, the N type dopant in raised silicon shapes 10b may out diffuse into the substrate to create N type source/drain regions 12b, and the P-type dopant in raised silicon shapes 10c may out diffuse into the substrate to create P type source/drain regions 12c. It is preferred, however, that the silicon-germanium channel region 11 and the heavily doped source/drain regions 12b and 12c do not contact each other to reduce the risk of junction leakage, which can occur if these regions directly interface.

Formation of the LDD regions in NMOSFET region 2 and in PMOSFET region 3 is next addressed and schematically shown in FIG. 7. Insulator hard mask shapes 7 may be removed by, for example, a dry or wet etch procedure, which may also remove the exposed portions of silicon oxide layer 8. A photoresist masking procedure may be used to protect PMOSFET region 3 from implantation of arsenic or phosphorous ions, which may be preferred at an energy of about 1 and about 5 KeV at a dose of about 5E14 and about 5E15 atoms/$cm^2$ and at an implant angle of about 0 and about 7°, creating N type LDD region 13b, in NMOSFET region 2. Another photoresist masking procedure may be used to protect NMOSFET region 2 during the formation of P type LDD region 13c in PMOSFET region 3, which may be accomplished, for example, via implantation of boron or $BF_2$ ions at an energy between about 1 and about 5 KeV at a dose between about 5E14 and about 5E14 atoms/cm$^2$ using an implant angle between about 0 and about 7°. An anneal procedure, such as a rapid thermal anneal (RTA) procedure, may be employed to activate the implanted ions of the LDD regions.

A second embodiment of this invention features the sequential implantation of germanium for formation of the strained silicon-germanium channel region and of the ions needed for formation of LDD regions. This embodiment entails photoresist block out masking of the PMOSFET region followed by implantation of germanium using a first implant angle, followed by implantation of the N type LDD ions performed using a second implant angle into NMOSFET areas. Another photoresist block out masking procedure is then used to protect the NMOSFET region from a germanium implantation procedure performed using a first implant angle followed by implantation of the P type LDD ions accomplished using a second implant angle.

Insulator spacers 14, shown schematically in FIG. 8, are next formed on the sides of conductive gate structures 6. Insulator spacers 14 may be formed by forming an insulator layer such as silicon oxide or silicon nitride, to a thickness between about 300 and about 1000 Angstroms via LPCVD or PECVD procedures. A selective anisotropic RIE procedure may be performed using $CHF_3$ or $CF_4$ as an etchant to define the insulator spacers 14.

Metal silicide shapes 15, shown schematically in FIG. 9, may be used to improve the conductivity of conductive gate structures 6, as well as to decrease source/drain resistance. The metal silicide shapes may be formed by depositing a metal layer such as titanium, nickel, tungsten, or cobalt to a thickness between about 50 and about 200 Angstroms via plasma vapor deposition (PVD) procedures. An anneal procedure performed at a temperature between about 400 and about 800° C. causes the metal layer to react with conductive gate structures 6 and the silicon shapes 10b and 10c to form metal silicide shapes 15. Portions of the metal layer overlying insulator spacers 14 remain unreacted. Selective removal of the unreacted portions of the metal layer may be accomplished, for example, via wet etch procedures. An additional anneal cycle may be used if desired to alter the phase of metal silicide regions 15, resulting in a lower resistance metal silicide shape.

While this invention has been particularly shown and described with reference to the preferred embodiments thereof, it will be understood by those skilled in the art that various changes in form and details may be made without departing from the spirit or scope of the invention.

What is claimed is:

1. A method of forming a metal oxide semiconductor field effect transistor (MOSFET) device on a semiconductor substrate, the method comprising the steps of:
   providing a gate insulator layer on said semiconductor substrate;
   forming a conductive gate structure and an overlying hard mask shape;
   forming first insulator spacers on sides of said conductive gate structure and on sides of said hard mask shape;
   forming doped silicon shapes on first areas of said semiconductor substrate, wherein said first areas of said semiconductor substrate are not covered by said conductive gate structure or by said first insulator spacers;
   removing said first insulator spacers exposing second areas of said semiconductor substrate;
   performing an ion implantation procedure to place ions in a portion of a third area of said semiconductor substrate underlying said conductive gate structure;
   annealing said substrate, the annealing causing heavily doped source/drain regions to be formed in the underlying semiconductor substrate;
   removing said hard mask shape;
   forming a lightly doped source/drain region in top portions of a second region of said semiconductor substrate, wherein said second region of said semiconductor substrate is located between said heavily doped source/drain region and said conductive gate structure; and
   forming second insulator spacers on sides of said conductive gate structure, overlying said second areas of said semiconductor substrate.

2. The method of claim 1, wherein said MOSFET device comprises an N channel metal oxide semiconductor field effect transistor (NMOSFET) device.

3. The method of claim 1, wherein said MOSFET device comprises a P channel metal oxide semiconductor field effect transistor (PMOSFET) device.

4. The method of claim 1, wherein said MOSFET device comprises a CMOS device comprising NMOSFET devices and PMOSFET devices.

5. The method of claim 1, wherein said conductive gate structure comprises a doped polysilicon gate structure having a thickness between about 800 and about 2000 Angstroms.

6. The method of claim 1, wherein said hard mask shape comprises silicon oxide or silicon oxynitride having a thickness between about 100 and about 500 Angstroms.

7. The method of claim 1, wherein said first insulator spacers are formed of silicon nitride and have a thickness between about 300 and about 1000 Angstroms.

8. The method of claim 1, wherein said doped silicon shapes are formed via an epitaxial growth procedure and have a thickness between about 200 and about 800 Angstroms, the doped silicon shapes being doped via implantation of arsenic or phosphorous ions at an energy between about 5 and about 40 KeV at a dose between about 5E14 and about 5E15 atoms/cm$^2$.

9. The method of claim 1, wherein said doped silicon shapes are formed via an epitaxial growth procedure and have a thickness between about 200 and about 800 Angstroms, the doped silicon shapes being doped via implantation of boron at an energy between about 3 and about 20 KeV at a dose between about 5L14 and about 5E15 atoms/cm$^2$.

10. The method of claim 1, wherein said removing said first insulator spacers includes performing a wet etch procedure using hot phosphoric acid as an etchant.

11. The method of claim 1, wherein said performing the ion implantation procedure is performed using germanium ions at an energy between about 50 and about 150 KeV at a dose between about 5L14 and about 1E16 atoms/cm$^2$ with an implant angle between about 15 and about 30°.

12. The method of claim 1, wherein said annealing includes performing a rapid thermal anneal (RTA) procedure performed at a temperature between about 800 and about 1050° C.

13. The method of claim 1, wherein said forming said lightly doped source/drain region is performed via implantation of arsenic or phosphorous ions at an energy between about 1 and about 5 KeV at a dose between about 5E14 and about 5E15 atoms/cm² with an implant angle between about 0 and about 7°.

14. The method of claim 1, wherein said forming said lightly doped source/drain region is performed via implantation of boron or $BF_2$ ions at an energy between about 1 and about 5 KeV at a dose between about 5E14 and about 5E15 atoms/cm² with an implant angle between about 0 and about 7°.

15. The method of claim 1, wherein said second insulator spacers include silicon nitride or silicon oxide having a thickness between about 300 and about 1000 Angstroms.

16. A method of forming a semiconductor device, the method comprising the steps of:
    forming a gate structure on a semiconductor substrate;
    forming first spacers alongside the gate structure, the semiconductor substrate being exposed adjacent the first spacers and each first spacer comprising a dummy liner and a dummy spacer formed on the dummy liner;
    forming raised conductive regions on a substantially planar surface of the semiconductor substrate adjacent the first spacers;
    removing at least a portion of the dummy spacers;
    forming a doped region in the substrate beneath the gate structure; and
    forming lightly-doped regions and heavily-doped regions alongside the gate structure.

17. The method of claim 16, wherein the forming raised conductive regions is performed at least in part by epitaxially growing silicon.

18. The method of claim 16, wherein the forming a doped region is performed using germanium ions at an energy between about 50 and about 150 KeV at a dose between about 5E14 and about 1E16 atoms/cm² with an implant angle between about 15 and about 30°.

19. The method of claim 16, wherein the raised conductive regions are formed via an epitaxial growth procedure and have a thickness between about 200 and about 800 Angstroms, the doped silicon shapes being doped via implantation of arsenic or phosphorous ions at an energy between about 5 and about 40 KeV at a dose between about 5E14 and about 5E15 atoms/cm².

20. The method of claim 16, wherein the raised conductive regions are formed via an epitaxial growth procedure and have a thickness between about 200 and about 800 Angstroms, the doped silicon shapes being doped via implantation of boron at an energy between about 3 and about 20 KeV at a dose between about 5E14 and about 5E15 atoms/cm².

21. The method of claim 16, wherein the forming lightly-doped regions and heavily-doped regions includes forming second spacers alongside the gate structure.

22. A method of forming a semiconductor device, the method comprising the steps of:
    forming a gate structure on a first surface of the semiconductor substrate, the first surface being substantially planar;
    forming raised conductive regions on the first surface of the semiconductor substrate on opposing sides of the gate structure, the raised conductive regions not being immediately adjacent the gate structure;
    forming an implant region in the substrate beneath the gate structure extending the length of a channel region, wherein the forming an implant region is performed after the forming the gate structure; and
    forming lightly-doped regions and heavily-doped regions alongside the gate structure.

23. The method of claim 22, wherein the forming raised conductive regions is performed at least in part by epitaxially growing silicon.

24. The method of claim 22, wherein the forming an implant region is performed using germanium ions at an energy between about 50 and about 150 KeV at a dose between about 5E14 and about 1E16 atoms/cm² with an implant angle between about 15 and about 30°.

25. The method of claim 22, wherein the raised conductive regions are formed via an epitaxial growth procedure and have a thickness between about 200 and about 800 Angstroms, the doped silicon shapes being doped via implantation of arsenic or phosphorous ions at an energy between about 5 and about 40 KeV at a dose between about 5E14 and about 5E15 atoms/cm².

26. The method of claim 22, wherein the raised conductive regions are formed via an epitaxial growth procedure and have a thickness between about 200 and about 800 Angstroms, the doped silicon shapes being doped via implantation of boron at an energy between about 3 and about 20 KeV at a dose between about 5E14 and about 5E15 atoms/cm².

27. The method of claim 22, wherein the forming lightly-doped regions and heavily-doped regions includes forming second spacers alongside the gate structure.

* * * * *

UNITED STATES PATENT AND TRADEMARK OFFICE
CERTIFICATE OF CORRECTION

PATENT NO. : 7,279,430 B2 Page 1 of 1
APPLICATION NO. : 10/919684
DATED : October 9, 2007
INVENTOR(S) : Chang et al.

It is certified that error appears in the above-identified patent and that said Letters Patent is hereby corrected as shown below:

In Col. 5, line 7, delete "5E14 atoms/cm$^2$" and insert --5E15 atoms/cm$^2$--.
In Col. 6, line 52, delete "5L14" and insert --5E14--.
In Col. 6, line 60, delete "5L14" and insert --5E14--.

Signed and Sealed this

Eleventh Day of December, 2007

JON W. DUDAS
*Director of the United States Patent and Trademark Office*